(12) United States Patent
Kim

(10) Patent No.: US 7,332,421 B2
(45) Date of Patent: Feb. 19, 2008

(54) METHOD OF FABRICATING GATE ELECTRODE OF SEMICONDUCTOR DEVICE

(75) Inventor: Yeong Sil Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 227 days.

(21) Appl. No.: 11/024,437

(22) Filed: Dec. 30, 2004

(65) Prior Publication Data

US 2005/0153531 A1    Jul. 14, 2005

(30) Foreign Application Priority Data

Dec. 31, 2003   (KR)   ...................... 10-2003-0101766

(51) Int. Cl.
*H01L 21/28* (2006.01)

(52) U.S. Cl. ........................................ 438/595; 438/592

(58) Field of Classification Search ................ 438/589, 438/592, 595
See application file for complete search history.

(56) References Cited

U.S. PATENT DOCUMENTS

| | | | |
|---|---|---|---|
| 6,200,865 B1 * | 3/2001 | Gardner et al. ............. | 438/291 |
| 6,214,681 B1 * | 4/2001 | Yu .............................. | 438/300 |
| 6,333,249 B2 * | 12/2001 | Kim et al. ................... | 438/592 |
| 6,387,765 B2 * | 5/2002 | Chhagan et al. ............. | 438/299 |
| 6,417,055 B2 * | 7/2002 | Jang et al. ................... | 438/303 |
| 6,440,808 B1 * | 8/2002 | Boyd et al. .................. | 438/305 |
| 6,440,830 B1 * | 8/2002 | Lopatin ........................ | 438/592 |
| 6,465,334 B1 * | 10/2002 | Buynoski et al. ............ | 438/591 |
| 6,500,743 B1 * | 12/2002 | Lopatin et al. .............. | 438/592 |
| 6,514,827 B2 * | 2/2003 | Kim et al. ................... | 438/292 |
| 6,524,901 B1 * | 2/2003 | Trivedi ........................ | 438/183 |
| 6,579,784 B1 * | 6/2003 | Huang ......................... | 438/595 |
| 6,589,866 B1 * | 7/2003 | Besser et al. ................ | 438/652 |
| 6,607,950 B2 * | 8/2003 | Henson et al. .............. | 438/197 |
| 6,617,212 B2 * | 9/2003 | Cho et al. .................... | 438/270 |
| 6,627,488 B2 * | 9/2003 | Lee ............................... | 438/183 |
| 6,642,581 B2 * | 11/2003 | Matsuda et al. ............. | 257/369 |
| 6,664,592 B2 * | 12/2003 | Inumiya et al. ............. | 257/330 |
| 6,703,297 B1 * | 3/2004 | Hellig ........................... | 438/585 |
| 6,753,215 B2 * | 6/2004 | Kasuya ........................ | 438/197 |
| 6,908,801 B2 * | 6/2005 | Saito ............................ | 438/199 |
| 7,071,086 B2 * | 7/2006 | Woo et al. ................... | 438/592 |
| 7,091,118 B1 * | 8/2006 | Pan et al. ..................... | 438/592 |
| 2001/0018243 A1 * | 8/2001 | Kim et al. ................... | 438/221 |
| 2002/0084498 A1 * | 7/2002 | Kasuya ........................ | 257/412 |
| 2002/0117726 A1 * | 8/2002 | Kasuya ........................ | 257/412 |
| 2003/0001205 A1 * | 1/2003 | Kim et al. ................... | 257/336 |

(Continued)

*Primary Examiner*—M. Wilczewski
(74) *Attorney, Agent, or Firm*—Lowe Hauptman Ham & Berner LLP

(57) ABSTRACT

A method of forming a gate electrode of a semiconductor device includes forming a damascene pattern for fabricating a metal electrode on an upper part of a poly silicon gate so as to prevent a metal electrode from being oxidized when the poly silicon electrode and the metal electrode are formed simultaneously. The method of forming the gate electrode of the semiconductor device includes the steps of forming a gate including poly silicon with a plurality of layers at an upper part of a silicon substrate, forming a spacer on a sidewall of the gate, vapor depositing inter layer dielectric between gates at the upper part of the substrate, forming a damascene pattern to which a metal electrode is formed, and completing the gate electrode including poly silicon and metal by filling the damascene pattern with a predetermined metal and planarizing the metal.

18 Claims, 5 Drawing Sheets

U.S. PATENT DOCUMENTS

| | | | |
|---|---|---|---|
| 2003/0034533 A1* | 2/2003 | Paton et al. | 257/413 |
| 2003/0235943 A1* | 12/2003 | Trivedi | 438/197 |
| 2004/0065930 A1* | 4/2004 | Lin et al. | 257/412 |
| 2005/0026408 A1* | 2/2005 | Barns et al. | 438/592 |
| 2005/0079695 A1* | 4/2005 | Carriere et al. | 438/592 |
| 2005/0179098 A1* | 8/2005 | Chan et al. | 257/412 |
| 2005/0260840 A1* | 11/2005 | Yeh et al. | 438/585 |
| 2006/0177983 A1* | 8/2006 | Trivedi | 438/270 |

* cited by examiner

METHOD OF FABRICATING GATE ELECTRODE OF SEMICONDUCTOR DEVICE

BACKGROUND OF THE INVENTION

1. Field of the Invention

The present invention relates to a method of fabricating a gate electrode of a semiconductor device, and more particularly, to a method of forming a damascene pattern, in which a metal electrode is fabricated on an upper part of a poly silicon gate so as to prevent a metal electrode from being oxidized when the poly silicon electrode and the metal electrode are formed simultaneously.

2. Discussion of the Related Art

FIG. 1A and FIG. 1B are cross-sectional diagrams describing a method of fabricating a gate formed of a poly silicon and a metal in accordance with the related art.

FIG. 1A is a cross sectional view showing the steps of forming a device separating film 2 on a silicon substrate 1, and sequentially forming a gate oxide film 3, a poly silicon 4, a metal film 5 and a capping film 6 on a front surface thereof, and forming a resist pattern 7 through a photo process.

A gate is formed by carrying out anisotropic etching using the resist pattern as an anisotropic mask as illustrated in FIG. 1B. A high temperature heat treatment of 1000° C. is applied, and an oxide film with a predetermined thickness is formed on a sidewall of the poly silicon. Therefore, an electric field generated on a sidewall member of the gate electrode is reduced such that reliability of a device is increased.

As recognized by the present inventor, the high temperature heat treatment has problems as follows. Since a metal film is oxidized at a relatively high speed compared to a poly silicon film, an oxide film is formed on the sidewall. The oxide film brings an increase of volume in a formative process thereof, and a width of the metal film is decreased, thereby increasing electrical resistance. In the process of ion implantation to be embodied later for forming a source/drain region, the oxide film acts as one kind of mask, reducing an ion-implantation amount at a particular location of a lower part of the oxide film. Therefore, there is a problem that the characteristic performance of a transistor is lowered as well as its yield.

SUMMARY OF THE INVENTION

Accordingly, the present invention is directed to a method of forming a gate electrode of a semiconductor device that substantially obviates the above-identified and other problems due to limitations and disadvantages of the related art.

An object of the present invention is to provide a method of forming a damascene pattern, in which a metal electrode is fabricated on an upper part of a poly silicon gate so as to prevent a metal electrode from being oxidized when the poly silicon electrode and the metal electrode are formed simultaneously.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for forming a gate electrode of a semiconductor device includes the steps of forming a gate including poly silicon with a plurality of layers at an upper part of a silicon substrate, forming a spacer on a sidewall of the gate, vapor depositing an inter layer dielectric between gates at the upper part of the substrate, forming a damascene pattern so as to form a metal electrode, and completing the gate electrode including poly silicon and metal by filling the damascene pattern with a predetermined metal, and planarizing the metal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
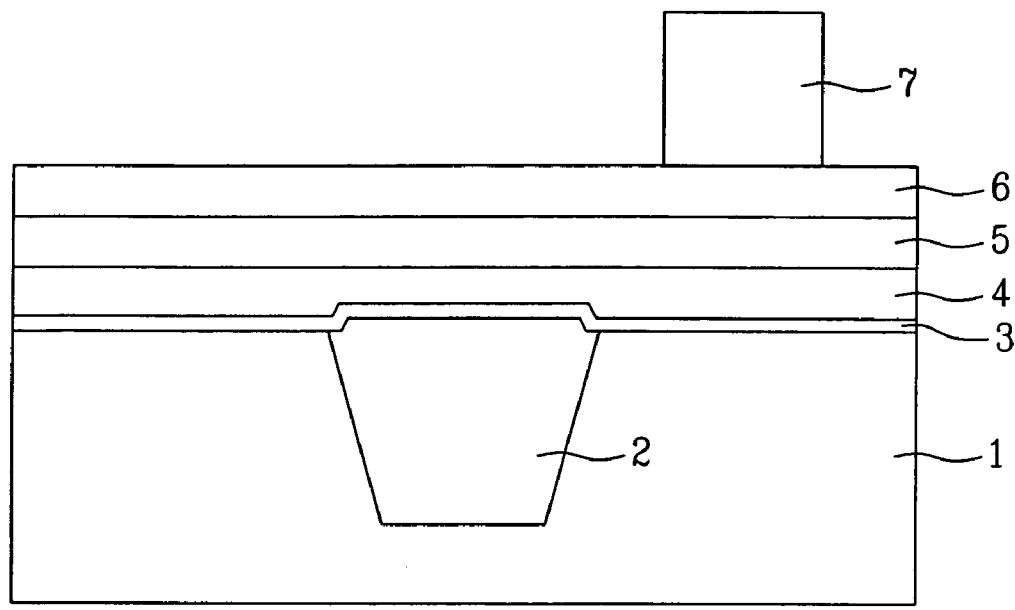
FIG. 1A to FIG. 1B illustrate cross sectional views for describing a method for fabricating a gate electrode in accordance with the related art.
Figure 1B:
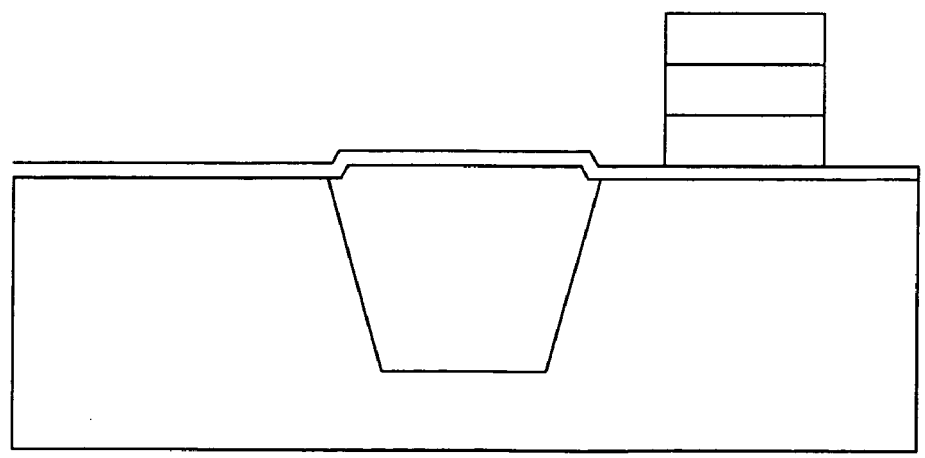
Figure 2A:
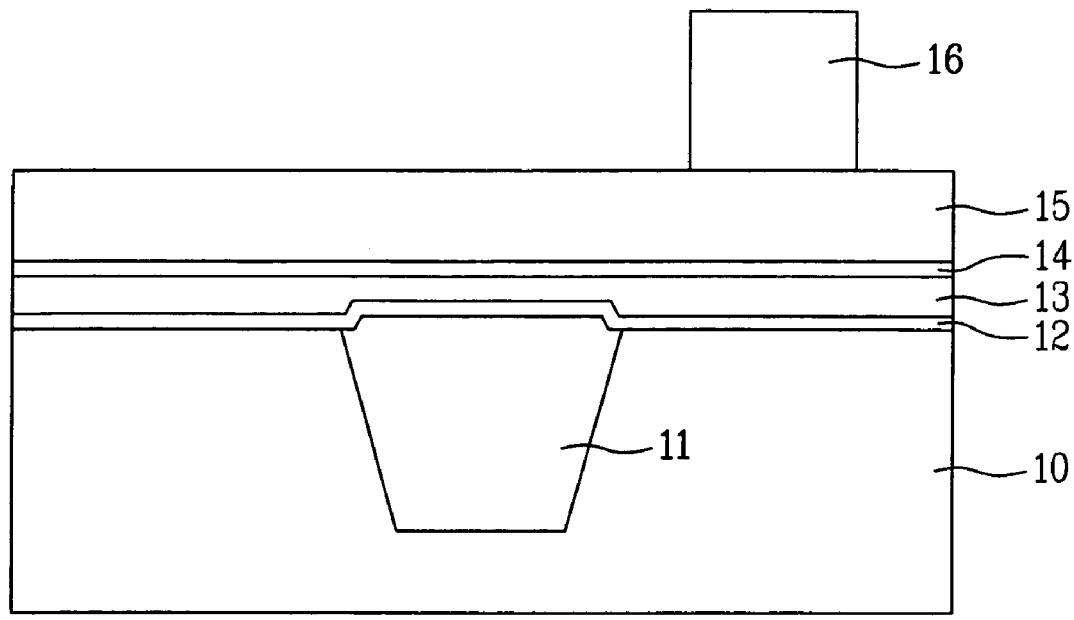
FIG. 2A to FIG. 2I illustrate cross sectional views for describing a method for fabricating a gate electrode in accordance with the present invention.
Figure 2B:
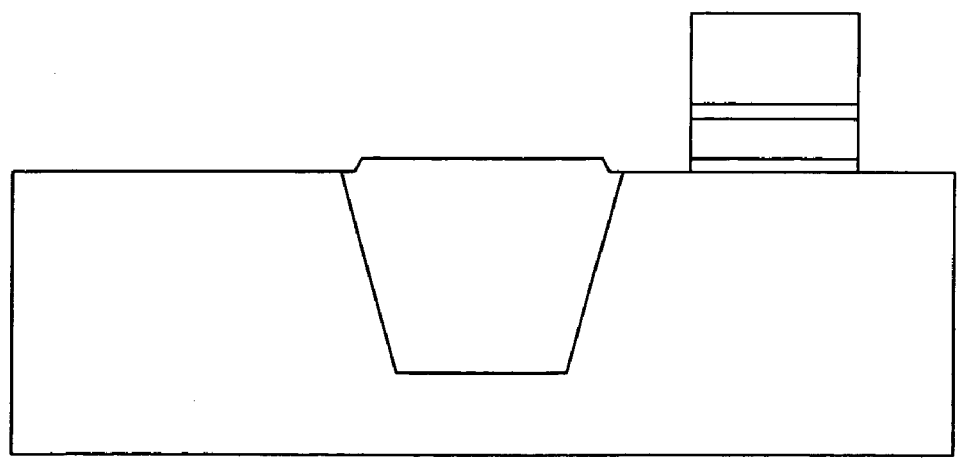

FIG. 2A and FIG. 2B illustrate a diagram showing a step of forming a gate including poly silicon. FIG. 2A illustrates a step of forming a shallow trench isolation (STI) device separating film 11 on a silicon substrate 10, and sequentially stacking up a gate oxide film 12, a first poly silicon 13, a buffer oxide film 14, a second poly silicon film 15 on an upper part of the substrate. Then, a pattern 16 is formed on the stack for use in forming the gate. FIG. 2B illustrates the gate formed by dry etching using plasma and employing the pattern as an etching mask.

Conventionally, after the gate poly silicon is vapor deposited, a metal such as tungsten is vapor deposited. Then, a nitride film for a hard mask is vapor deposited to end the photo process. In the present invention, however, a second poly silicon material is vapor deposited on an upper part of the buffer oxide film, and the second poly silicon is removed for a metal electrode to be formed later. Accordingly, the metal electrode is prevented from being oxidized by finishing all heat treatment before a formation of the metal electrode.

In this instance, it is desirable that the first poly silicon at the upper part of the gate oxide film is 600 to 1500 Å thick and the buffer oxide film 150 to 200 Å thick. Since the second poly silicon is, as aforementioned, an important factor for determining a height of the metal electrode to be formed later, the thickness of the second poly silicon is adjusted according to characteristic of a device to be embodied.

Figure 2C:
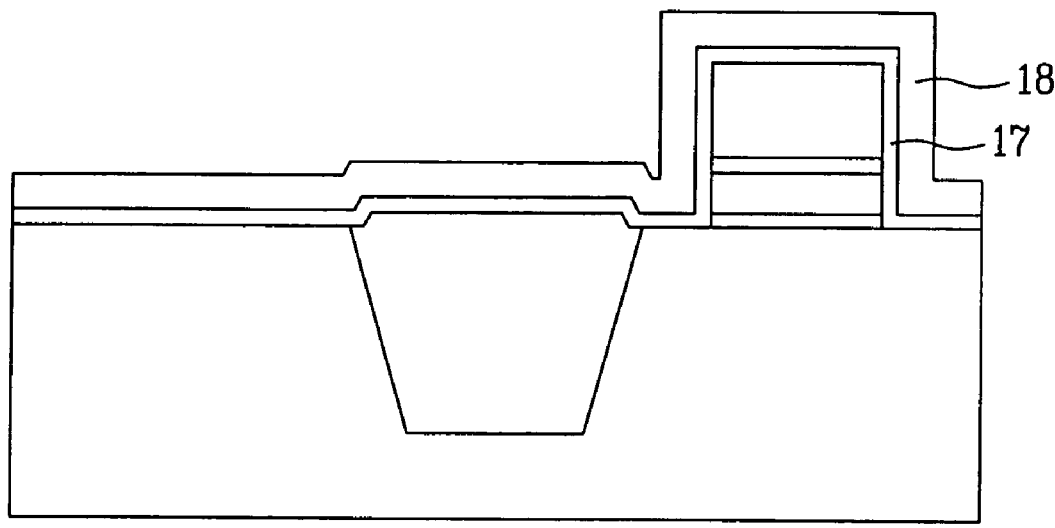
Figure 2D:
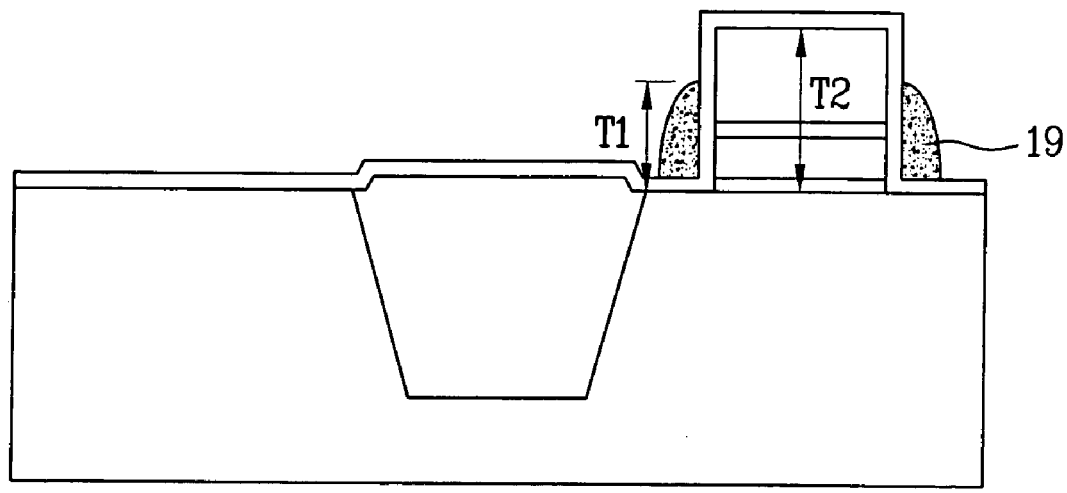

FIG. 2C to FIG. 2D illustrate diagrams showing a step of forming a gate spacer. After the second buffer oxide film 17 and a nitride film 18 are vapor deposited, a gate spacer 19 is formed by a dry etching process using plasma. In this case, the second buffer oxide film is preferably 150 to 400 Å thick, and the nitride is 700 to 1000 Å thick. In this instance, the thickness of the nitride film is changed according to a desired device characteristic and circuit structure.

Another feature of the present invention is that the height of the spacer (T1) should be lower than the height of the gate (T2) for the following reason. When an inter layer dielectric is planarized by chemical mechanical planarization (CMP), the second poly silicon is maintained at a predetermined height by exposing the second poly silicon first employed as a etch stop film, thus the metal electrode to be formed later can have a predetermined thickness.

In other words, in the CMP process, the second material is sensed by change of torque and recognized as a stop film of the planarization. The torque generated when a second material having a hardness different from that of a first material which is polished first is exposed. Accordingly, when the height of the spacer (T1) and the height of the gate thickness (T2) are the same or similar to each other, the second poly silicon is employed as the stop film. The second poly silicon however acts as noise in the detection process, thereby reducing stability of the CMP process.

Figure 2E:
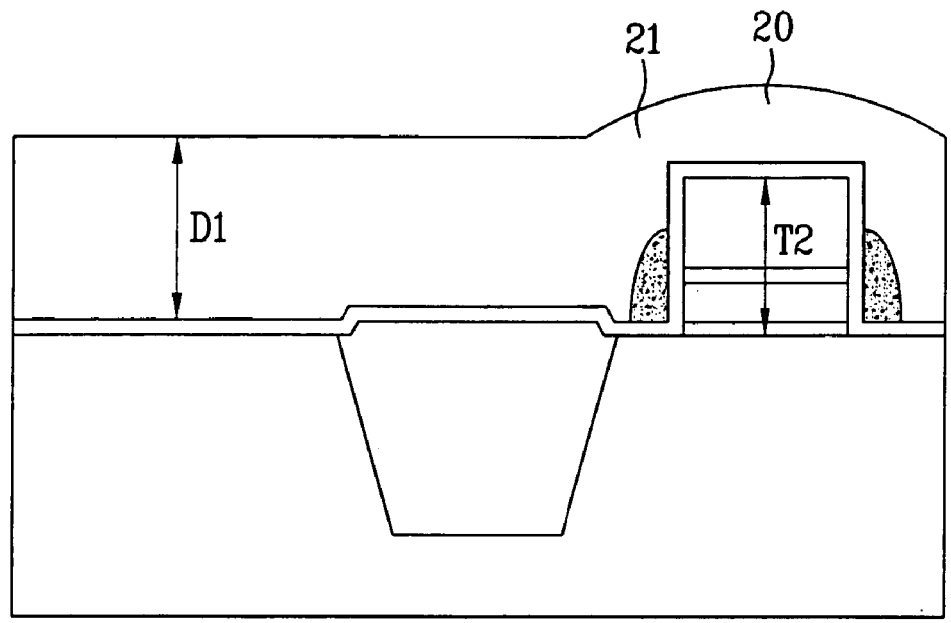
Figure 2F:
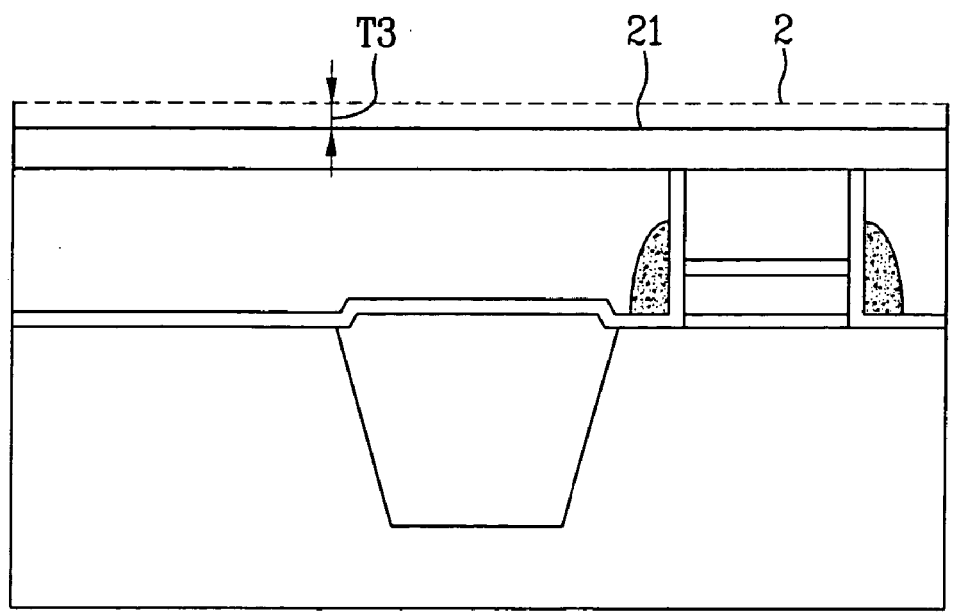

FIG. 2E to FIG. 2F are cross sectional views showing steps of vapor depositing the inter layer dielectrics 20, and completing planarization. An insulating film with a predetermined width is vapor deposited for insulation between gates. In this instance, the thickness (D1) of the insulating film should be thicker than the thickness (T2) of the gate including the second buffer oxide film. Then, the insulating film is planarized by CMP or dry etched-back. When the CMP is employed for planarizing the insulating film, the insulating film is global planarized to a height of 2 indicated as a dotted line of FIG. 2F by using time polishing that determines a stop depth.

In the former case, an additional etch of as much as T3 is required for exposing the upper part of the gate. The additional etching is carried out by wet etch using chemicals being capable of etching the insulating film, or by plasma dry etch using the second poly silicon as a stop film.

Figure 2G:
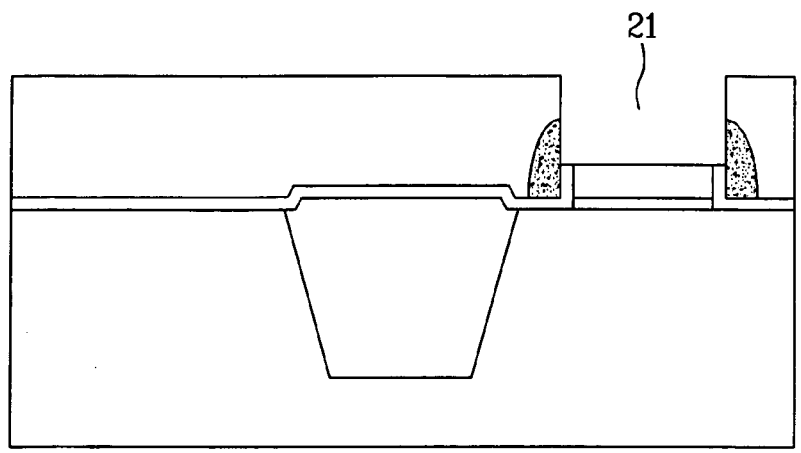

FIG. 2G illustrates a cross sectional view showing a step of forming a damascene pattern 21 having a metal electrode formed therein. A buffer oxide film at an upper part of the poly silicon is removed, the buffer oxide film being employed as the second poly silicon and the gate. The second poly silicon and the buffer oxide film are etched by chemical dry etch (CDE) using chemicals, without having damage from plasma. After the buffer oxide film is removed, heat treatment is carried out by relieving the electric field formed at a corner portion of the poly silicon gate, so as to increase reliability of the device.

Figure 2H:
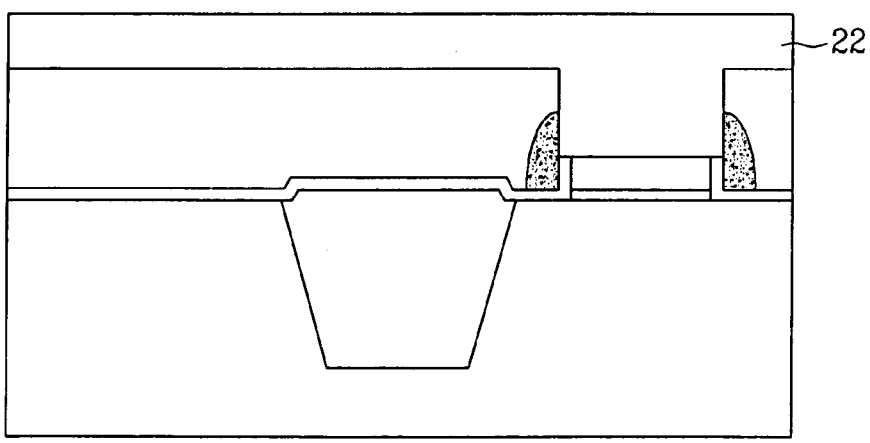
Figure 2I:
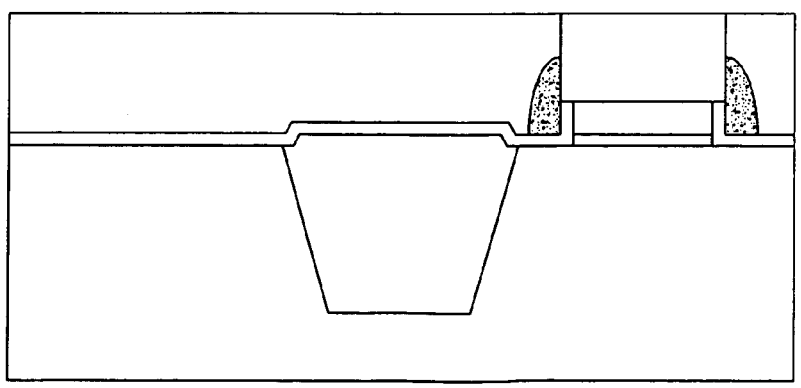

FIG. 2H to FIG. 2I are cross sectional views showing a step of completing the gate electrode including poly silicon and a metal. After the buffer oxide film is etched and removed, a metal to be a metal electrode is vapor deposited and planarized, whereby the metal electrode is completed instead of the second poly silicon. A method of planarizing the metal includes CMP and dry etch-back.

The method for fabricating a gate electrode of a semiconductor device includes a step of forming a damascene pattern for forming the metal electrode at an upper part of the poly silicon gate, and thereby has an effect of preventing the metal electrode from being oxidized when the poly silicon and the metal electrode are formed simultaneously. Furthermore, since metal electrode can be formed using various metals, electric characteristic of the device is improved, thereby increasing performance of the device.

This application claims the benefit of Korean patent application No. P2003-01766, filed on Dec. 31, 2003, the entire contents of which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming a gate electrode of a semiconductor device, comprising the steps of:
   forming a gate with a material that includes poly silicon with a plurality of layers at an upper part of a silicon substrate;
   forming a spacer on a sidewall of the gate by etching a nitride film so that the spacer has a height less than that of the gate;
   vapor depositing an inter layer dielectric between the gate and an adjacent gate at the upper part of the substrate;
   forming a damascene pattern so as to form a metal electrode; and
   completing the gate electrode including poly silicon and metal by filling the damascene pattern with a predetermined metal and planarizing the metal.

2. The method of claim 1, wherein the step of forming the gate comprises the steps of:
   forming a device separating film at an upper part of the silicon substrate;
   sequentially stacking a gate oxide film, a first poly silicon, a buffer oxide film, and a second poly silicon material on an upper surface of the substrate; and
   completing the step of forming the gate by etching at least one layer of the plurality of layers using the pattern as an etch mask.

3. The method of claim 2, wherein, for the etching step, dry etch is employed using plasma.

4. The method of claim 2, wherein the second poly silicon has a thickness in an inclusive range of 60 .ANG. to 1500 .ANG.

5. The method of claim 2, wherein the buffer oxide film has a thickness in an inclusive range of 120 .ANG. to 300 .ANG.

6. The method of claim 2, wherein the second poly silicon serves a function of setting a height of the metal electrode, and controlling a thickness of vapor deposition according to a predetermined device characteristic.

7. The method of claim 1, wherein the step of forming the spacer on the gate sidewall comprises the steps of: vapor depositing the second buffer oxide film and a nitride film on the substrate having the poly silicon gate with a thickness of T1.

8. The method of claim 7, wherein, for etching the nitride film, dry etching is employed using plasma.

9. The method of claim 7, wherein the second buffer oxide film is in an inclusive range of 150 .ANG. to 400 .ANG. thick.

10. The method of claim 7, wherein the nitride film is in an inclusive range of 700 .ANG. to 1500 .ANG. thick.

11. The method of claim 7, wherein the thickness of the nitride film is changed according to a performance characteristic of a device, and to a predetermined circuit structure.

12. The method of claim 1, wherein a thickness of the inter layer dielectric between gates is thicker than that of the poly silicon gate.

13. The method of claim 1, wherein the step of vapor depositing an inter layer dielectric includes planarizing the inter layer dielectric by at least one of CMP and a dry etch-back method.

14. The method of claim 2, wherein step of sequentially stacking includes planarizing by CMP using the second poly silicon as a stop.

15. The method of claim 2, further comprising planarizing the inter layer dielectric with a CMP process by time polishing to a predetermined height higher than the second poly silicon, and further comprising at least one of wet etching and plasma dry etching the plurality of layers.

16. The method of claim 2, wherein the step of forming the damascene pattern comprises a step of removing the second poly silicon and the buffer oxide film.

17. The method of claim 16, wherein the step of removing the second poly silicon and the buffer oxide film is carried out by the dry etch using chemical.

18. The method of claim 1, wherein the step of planarizing the metal of the damascene pattern is carried out by at least one of CMP and dry etch-back.

* * * * *